US010056274B2

(12) United States Patent
Rice et al.

(10) Patent No.: US 10,056,274 B2
(45) Date of Patent: Aug. 21, 2018

(54) SYSTEM AND METHOD FOR FORMING A SEALED CHAMBER

(71) Applicant: APPLIED MATERIALS ISRAEL LTD., Rehovot (IL)

(72) Inventors: Michael R. Rice, Pleasanton, CA (US); Paul Reuter, Austin, TX (US); William (Ty) Weaver, Austin, TX (US); Travis Morey, Austin, TX (US); Natan Schlimoff, Rehovot (IL); Igor Krivts (Krayvitz), Rehovot (IL); Israel Avneri, Ramat-Gan (IL); Yoram Uziel, Misgav (IL); Erez Admoni, Petach-Tikva (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 15/040,904

(22) Filed: Feb. 10, 2016

(65) Prior Publication Data
US 2016/0163570 A1 Jun. 9, 2016

Related U.S. Application Data

(63) Continuation of application No. PCT/US2014/050593, filed on Aug. 11, 2014.
(Continued)

(51) Int. Cl.
*H01L 21/67* (2006.01)
*H01L 21/68* (2006.01)
(Continued)

(52) U.S. Cl.
CPC .. *H01L 21/67126* (2013.01); *H01L 21/67748* (2013.01); *H01L 21/67751* (2013.01); *H01L 21/68714* (2013.01)

(58) Field of Classification Search
CPC ......... H01L 21/67126; H01L 21/67748; H01L 21/67751; H01L 21/68714; H01L 21/68764; H01L 21/68785
See application file for complete search history.

(56) References Cited

U.S. PATENT DOCUMENTS 4,191,385 A * 3/1980 Fox ................... H01L 21/67011
277/432
4,816,638 A * 3/1989 Ukai ..................... H01J 37/185
156/345.31
(Continued)

FOREIGN PATENT DOCUMENTS

| JP | 2007116059 A | 5/2007 |
| WO | 05140743 A | 6/1993 |
| WO | 2015023603 | 2/2015 |

OTHER PUBLICATIONS

PCT/US2014/050593, "International Preliminary Report on Patentability", dated Feb. 25, 2016, 8 pages.
(Continued)

*Primary Examiner* — James Keenan
(74) *Attorney, Agent, or Firm* — Kilpatrick Townsend & Stockton LLP

(57) ABSTRACT

According to an embodiment of the invention, there is provided a system, comprising: a first chamber; a second chamber; a chuck; a movement system; wherein the first chamber comprises: a first element that has a first surface; a first chamber housing that comprises a second surface; wherein the first surface and the second surface come into proximity with each other at a first interface; a supporting element for supporting the chuck when the chuck is positioned within the first chamber; and a first dynamic seal formed at the first interface and is arranged to seal the first chamber from the movement system; wherein the second chamber comprises: a second chamber housing; a movement (Continued)

system that is arranged to introduce movement between (a) the first chamber housing and (b) the first element and the chuck; and a movement control element for mechanically coupling the first element to the movement system.

13 Claims, 7 Drawing Sheets

Related U.S. Application Data

(60) Provisional application No. 61/865,042, filed on Aug. 12, 2013.

(51) Int. Cl.
*H01L 21/677* (2006.01)
*H01L 21/687* (2006.01)

(56) References Cited

U.S. PATENT DOCUMENTS

| | | | | |
|---|---|---|---|---|
| 6,899,765 B2* | 5/2005 | Krivts | ............... | H01L 21/67126 118/719 |
| 7,001,129 B2* | 2/2006 | Kim | ................. | H01L 21/67126 414/217 |
| 7,022,009 B2* | 4/2006 | Kim | ................. | H01L 21/67253 414/935 |
| 7,026,581 B2* | 4/2006 | Pharand | ............ | H01L 21/67751 118/724 |
| 7,428,850 B2* | 9/2008 | Naftali | .............. | H01L 21/67126 73/865.8 |
| 7,654,221 B2* | 2/2010 | Lubomirsky | ..... | H01L 21/67126 118/319 |
| 7,828,504 B2* | 11/2010 | Pharand | ............ | H01L 21/67201 414/217 |
| 9,302,358 B2* | 4/2016 | Krayvitz (Krivts) | .............. | H01L 21/6719 |
| 2003/0185715 A1 | 10/2003 | Krivts et al. | | |
| 2006/0102078 A1 | 5/2006 | Fairbairn et al. | | |
| 2013/0004288 A1 | 1/2013 | Reed et al. | | |
| 2013/0196514 A1 | 8/2013 | Ewert et al. | | |

OTHER PUBLICATIONS

PCT/US2014/050593, "International Search Report and Written Opinion", dated Nov. 25, 2014, 11 pages.

* cited by examiner

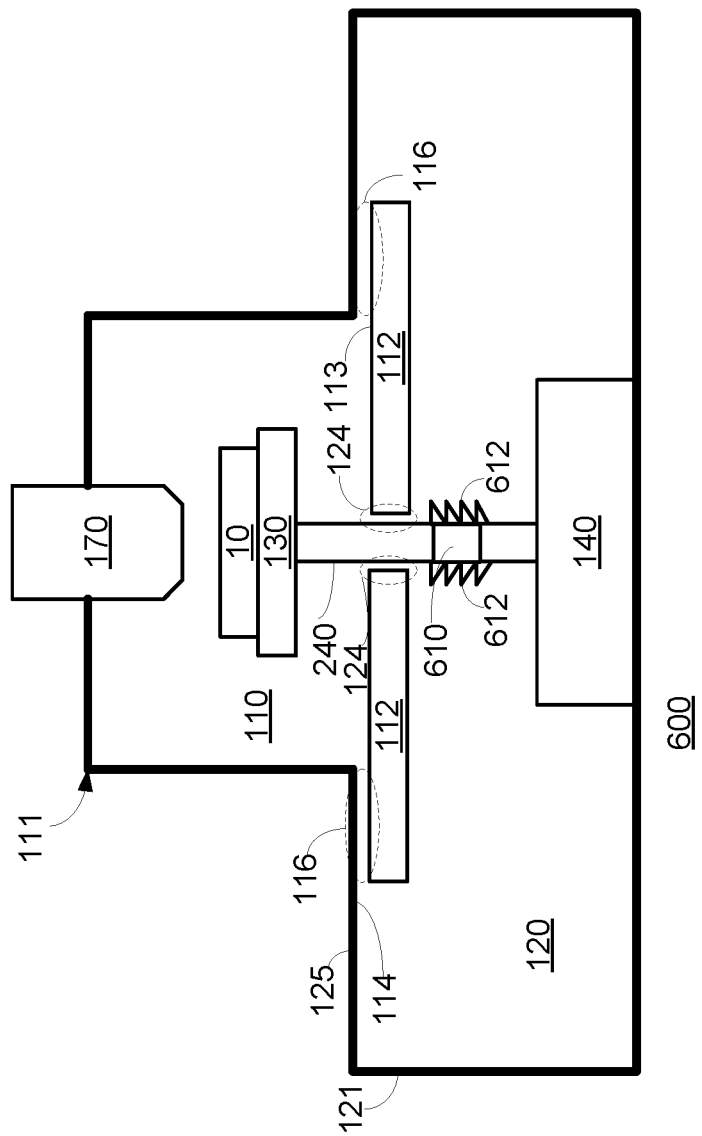

Placing a substrate on a chuck that is located within a first chamber of the system. The system also includes a second chamber, and a movement system. The first chamber includes (i) a first element that has a first surface, (ii) a first chamber housing that includes a second surface, the first surface and the second surface come into proximity with each other at a first interface, (iii) a supporting element for supporting the chuck; and (iv) a first dynamic seal formed at the first interface and is arranged to seal the first chamber from the movement system. The second chamber includes (i) a second chamber housing; a movement system that is arranged to introduce movement between (a) the first chamber housing and (b) the first element and the chuck; and a movement control element for mechanically coupling the first element to the movement system. 710

Applying an inspection or manufacturing process within the first chamber while sealing, by the first dynamic seal, the first chamber from the second chamber. Thus, contaminants generated within the second chamber are prevented from reaching the substrate. The applying may include introducing movement, by the movement system, between the substrate and the first chamber housing. 720

SYSTEM AND METHOD FOR FORMING A SEALED CHAMBER

CROSS-REFERENCES TO RELATED APPLICATIONS

This application is a continuation of and claims priority to PCT/US2014/050593, filed Aug. 11, 2014; which claims the benefit of U.S. Provisional Patent Application No. 61/865,042, filed Aug. 12, 2013. The disclosures of each of the PCT/IB2014/061637 and 61/865,042 applications are herein incorporated by reference in their entirety for all purposes.

BACKGROUND OF THE INVENTION

The present invention relates to semiconductor inspection systems and/or processing, and more particularly to chambers for processing or inspecting substrates such as semiconductor wafers, reticles, and the like for the manufacture of integrated circuits (ICs). Integrated circuits are manufactured by building semiconductor devices on one or more substrates in a process chamber. The semiconductor devices are interconnected to form the IC. A semiconductor wafer may have one, or many, or a few ICs.

Semiconductor devices are fabricated on substrates such as silicon wafers by processes that involve depositing, patterning, and removing of materials on the substrates. Deposition processes such as chemical vapor deposition (CVD) or physical vapor deposition (PVD) may be used to deposit a layer of material on a substrate. Photolithography techniques may be used to create a pattern on a layer of material to control where etching, depositing, or implanting will occur. Etch processes may be used to remove portions of a deposited layer, so that other materials may be deposited in the removed portions. Ion implantation processes may be used to change the properties of a deposited layer of material by physically bombarding and implanting dopants into the deposited layer. By using various ones of these process steps, semiconductor devices, and, thus, integrated circuits are created on the substrate.

There is a need to allow efficient and relatively contamination free system and method for moving a substrate while maintaining predefined conditions within a first chamber in which the substrate is placed.

BRIEF SUMMARY OF THE INVENTION

According to various embodiments of the invention there may be provided a system that may include a first chamber, a second chamber, a chuck and a movement system.

Any combinations of any of the components of any of the figures can be provided. Any combination of any of the mentioned above systems can be provided.

According to an embodiment of the invention, there is provided a system, comprising: a first chamber; a second chamber; a chuck; a movement system; wherein the first chamber comprises: a first element that has a first surface; a first chamber housing that comprises a second surface; wherein the first surface and the second surface come into proximity with each other at a first interface; a supporting element for supporting the chuck when the chuck is positioned within the first chamber; and a first dynamic seal formed at the first interface and is arranged to seal the first chamber from the movement system; wherein the second chamber comprises: a second chamber housing; a movement system that is arranged to introduce movement between (a) the first chamber housing and (b) the first element and the chuck; and a movement control element for mechanically coupling the first element to the movement system.

According to an embodiment of the invention there is provided chamber elements defining a first chamber to be utilized during a semiconductor manufacturing stage or a semiconductor inspection stage, the chamber elements comprising: a first element that has a first surface; a first chamber housing that comprises a second surface; wherein the first surface and the second surface come into proximity with each other at a first interface; a supporting element for supporting a chuck to be positioned within the first chamber; wherein the first element is arranged to be moved in relation to the first chamber housing by a movement control element that mechanically couples the first element to a movement system that is positioned outside the first chamber; and a first dynamic seal formed at the first interface and is arranged to seal the first chamber from the movement system.

According to an embodiment of the invention, the system further comprised pressure control elements for maintaining the first chamber at a lower pressure level than the second chamber. According to another embodiment of the invention, the internal and second chambers are maintained at substantially a same pressure level. According to an embodiment of the invention, the system further comprises filtering elements arranged to prevent contaminants generated within the second chamber to enter the first chamber. According to an embodiment of the invention, the first element is a plate. According to another embodiment, the first element defines an aperture and the supporting element and the movement control element are connected to each other to form a support and movement control module that passes through the aperture.

According to an embodiment of the invention, the system further comprises a second dynamic seal formed at a second interface between the aperture and the support and movement control module. According to an embodiment of the invention, the aperture is located at a center of the first element. According to another embodiment of the invention, the supporting element and the movement control element are connected to each other to form a support and movement control module; and wherein the support and control module further comprises a horizontal movement stage. According to an embodiment of the invention, the system further comprises a load lock mechanism for allowing the insertion of a substrate to the first chamber and a removal of the substrate from the first chamber.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof may best be understood by reference to the following detailed description when read with the accompanying drawings in which:

FIG. 6 illustrates a system according to an embodiment of the invention; and FIG. 7 illustrates a method according to an embodiment of the invention.

Figure 1:
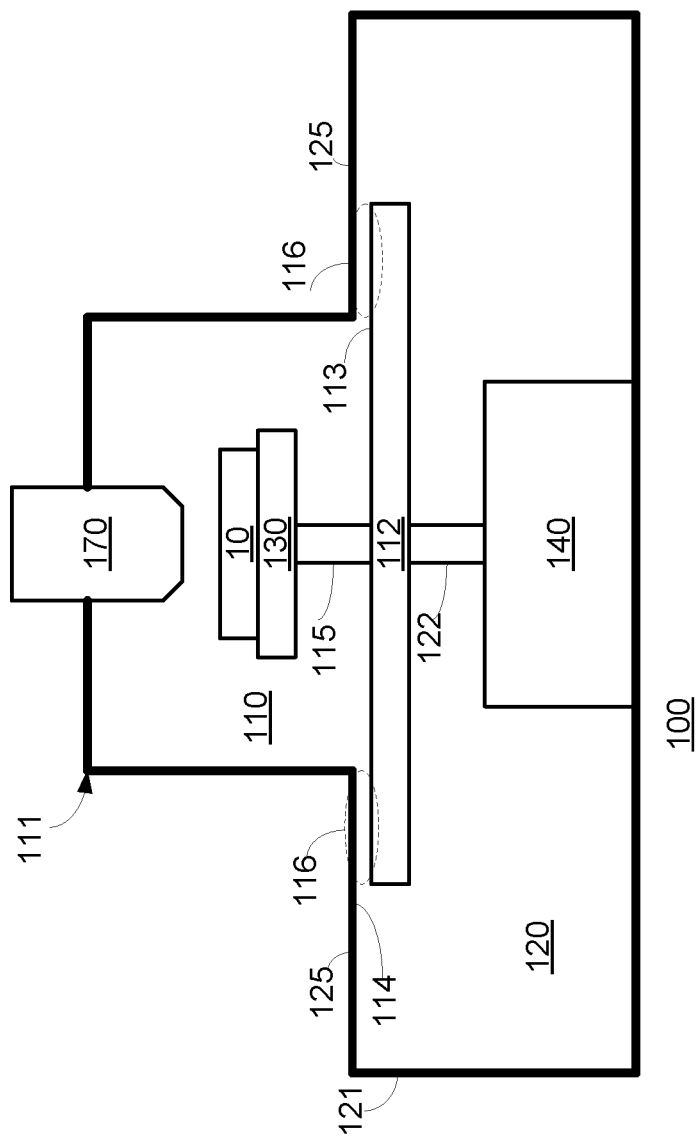
FIG. 1 illustrates a system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may, for the most part, be implemented using electronic components and modules known to those skilled in the art, details will not be explained in any greater extent than that considered necessary as illustrated above, for the understanding and appreciation of the underlying concepts of the present invention and in order not to obfuscate or distract from the teachings of the present invention.

The assignment of the same reference numbers to various components may indicate that these components are similar to each other.

Dual Chamber System

There is provided a system that prevents sources of contamination from contaminating an inspected substrate. The system includes a first chamber and a second chamber. The first chamber can be located above the second chamber but other spatial relationships between the chambers may exist.

The substrate, during inspection or manufacturing processes, is located in the first chamber in which predetermined conditions (contamination level, vacuum level, temperature and the like) are maintained even when the substrate is moved in relation to a housing of the first chamber.

The movement may be introduced by a movement system (such as mechanical stage) located within the second chamber. Cables, control device and various other components can be located within the second chamber in order to reduce and even eliminate the amount of contaminating elements generated within the first chamber. The first chamber can be free of moving parts.

The first and second chambers can be isolated from each other by using one or more dynamic seals.

The first chamber can include a first element such as a plate that has a first surface. The first surface of the plate and a second surface of the housing of the first chamber are proximate to each other at a first interface. A first dynamic seal can be formed at the first interface and can include one or more air bearings that allow a contactless sealing.

Figure 2:
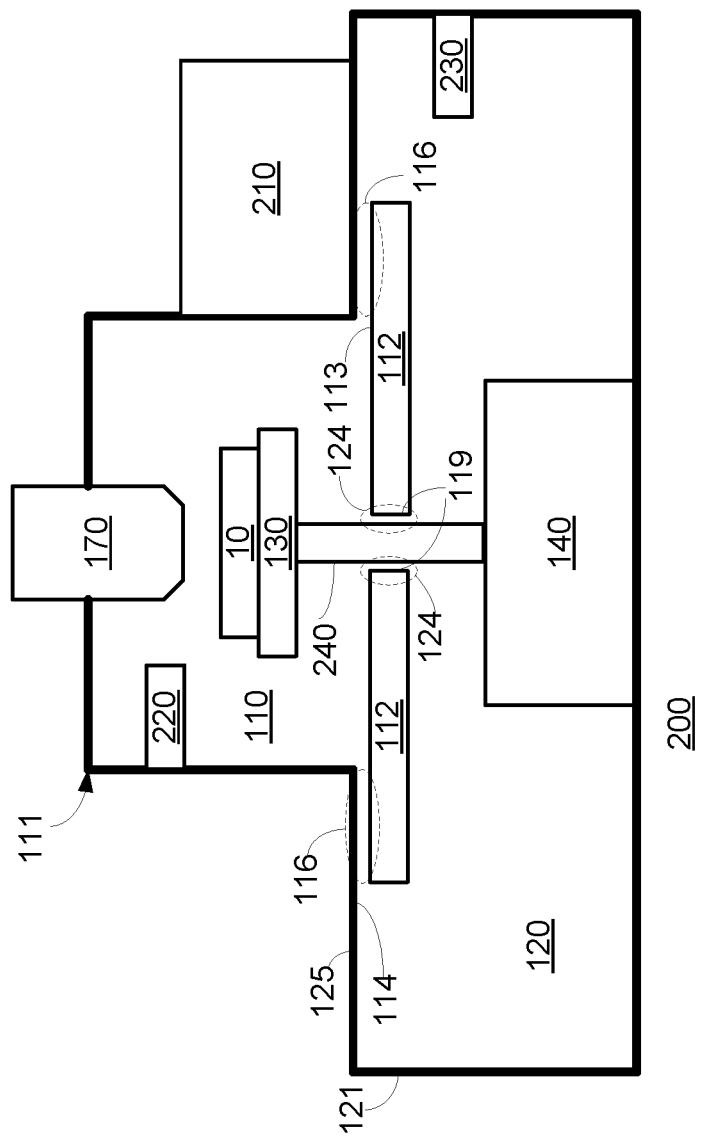
FIG. 2 illustrates a system according to an embodiment of the invention.
Figure 3:
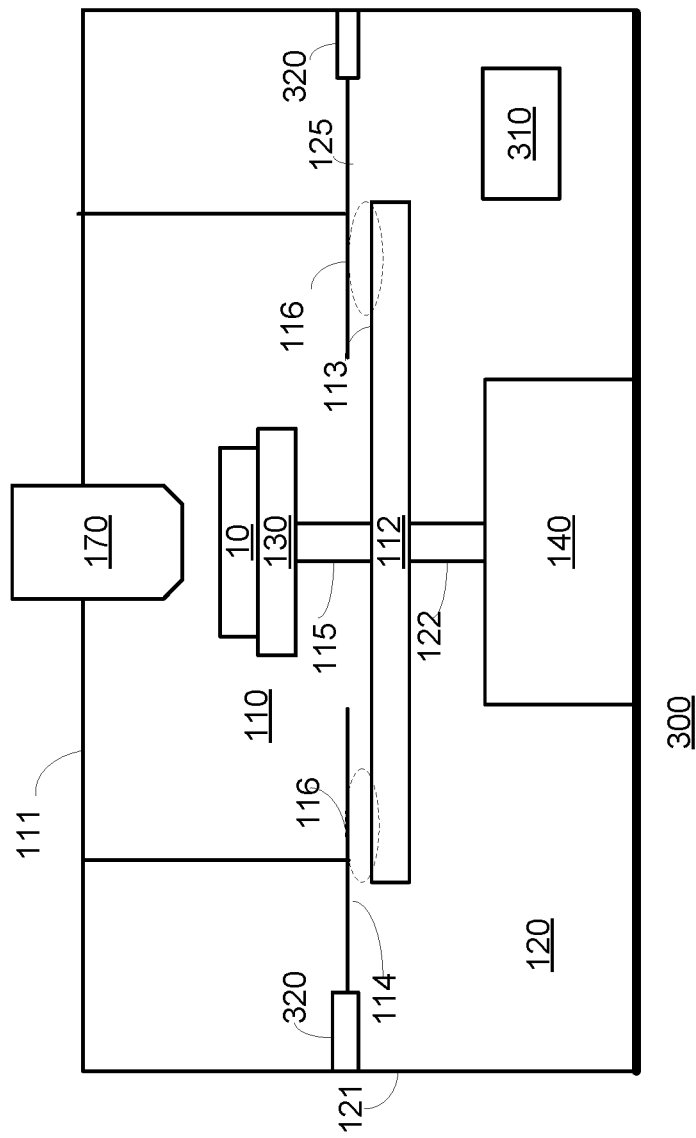
FIG. 3 illustrates a system according to an embodiment of the invention.

The first and second surfaces may be horizontal, wherein the second plate can be positioned above the first surface as illustrated in FIGS. 1-3.

The combination of the housing of the first chamber and the first element can form an inner space of radial symmetry or an inner space of other geometrical properties.

The second chamber can be maintained at a higher pressure in relation to the first chamber or at the same pressure level.

The first element has to withstand a limited load that is responsive to the pressure difference between the first and second chamber.

Contamination which is generated by the movement system (for example, XY stage, XYZ stage, R$\Theta$ stage or R$\Theta$Z stage), by bearing and from plastic cables may be prevented from reaching the first chamber due to a positive air flow formed by the first dynamic seal. The first dynamic seal can be arranged to generate an air flow directed towards the second chamber and thus repel contamination from entering the first chamber.

FIG. 1 illustrates a system 100 according to an embodiment of the invention.

System 100 includes a first chamber 110, a second chamber 120, a chuck 130, and a movement system 140 such as an XYZ mechanical stage capable of moving the chuck 130 along three directions that are normal to each other.

System 100 includes a housing that may include a first chamber housing 111 and a second chamber housing 121. It is noted that the first and second chamber housings 111 and 121 can share at least one structural element—such as horizontal plates 125 that have the second surface 114

The first chamber 110 may include:
a. A first element 112 that has a first surface 113.
b. A first chamber housing 111 that includes a second surface 114.
c. A supporting element 115 for supporting the chuck when the chuck is positioned within the first chamber.
d. A first dynamic seal 116 formed at a first interface (wherein the first and second surfaces 113 and 114 are parallel and proximate to each other) and is arranged to seal the first chamber 110 from the movement system 140.

The second chamber 120 may include the movement system 140 and a movement control element 122 for mechanically coupling the first element 112 to the movement system 140.

The movement system 140 is arranged to introduce movement between the (a) the first chamber housing 111 and the second chamber housing 121, and (b) the first element 112 and the chuck 130.

The first chamber 110 is illustrates in FIG. 1 as including a column 170 of an inspection or review system. It is noted that the first chamber 110 can include multiple inspection, metrology, review tools or can allow such tools to view the substrate 10 (for example—by having a sealed window within the first chamber housing 111). The first chamber 110 can be used for manufacturing processes such as deposition, deposition and the like.

FIG. 2 illustrates system 200 according to an embodiment of the invention. System 200 differs from system 100 by including a load lock mechanism 210 for loading and unloading substrates from and to the first chamber 110.

System 200 also illustrates first and second chamber pressure control elements 220 and 230 for controlling the pressure within each of the first and second chambers 110 and 120. The pressure control elements 220 and 230 may include vacuum pumps, exhaust pumps, pressure valves, pressure sensors and the like. The pressures within the first and second chambers may be equal to each other or may differ from each other.

FIG. 2 also illustrates the first element 112 as including an aperture 119 (located in its center) through which a support and movement control module 240 passes. The support and movement control module 240 includes the supporting element 115 and the movement control element 122. Elements 115 and 122 may be connected to each other.

The aperture 119 can be sealed by a flexible bellows or can be sealed by elements such as a second dynamic seal 124 that is formed at second interface between the aperture 119 and the support and movement control module 240.

FIG. 3 illustrates system 300 according to an embodiment of the invention.

System 300 differs from system 100 by allowing the first and second chambers to be maintained at the same pressure level by sharing at least one pressure control element 310. Vacuum may be shared between both chambers and a filtering element such as filters 320 (or multiple filters) may be located between the first and second chambers 110 and 120 in order to block contamination generated in the second chamber 120 to enter the first chamber 110.

The filtering elements may be positioned at an outlet of a pipe (not shown) that is connected to both chambers. The filtering element, additionally or alternatively, may be located in a sealing plate or externally to the first and second chambers.

Figure 4:
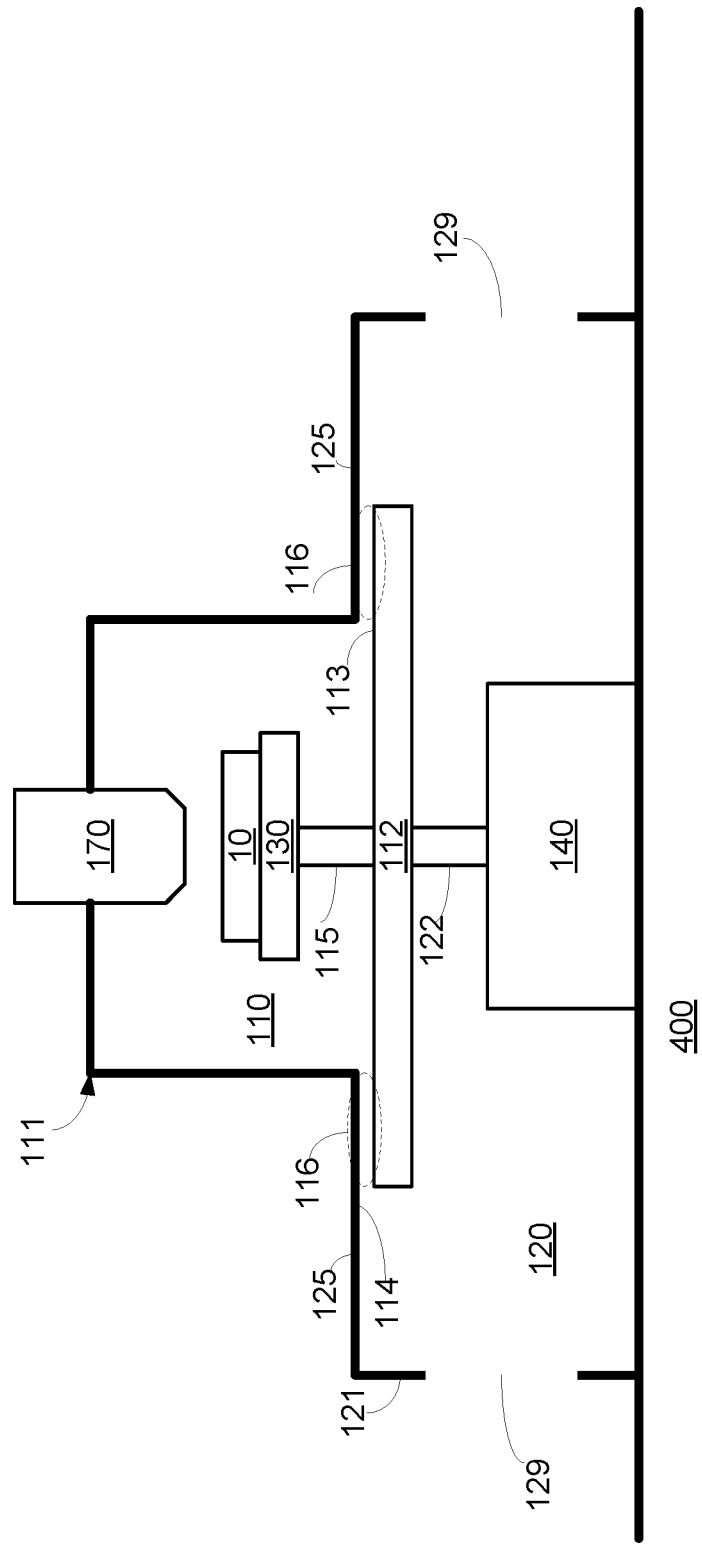
FIG. 4 illustrates a system according to an embodiment of the invention.

FIG. 4 illustrates system 400 according to an embodiment of the invention. System 400 differs from system 100 by having a second chamber 120 that is maintained at ambient (atmospheric) conditions—and its second chamber housing 121 may include one or more apertures (such as 129) to the environment that surrounds the system 400.

First Dynamic Seal

Figure 5:
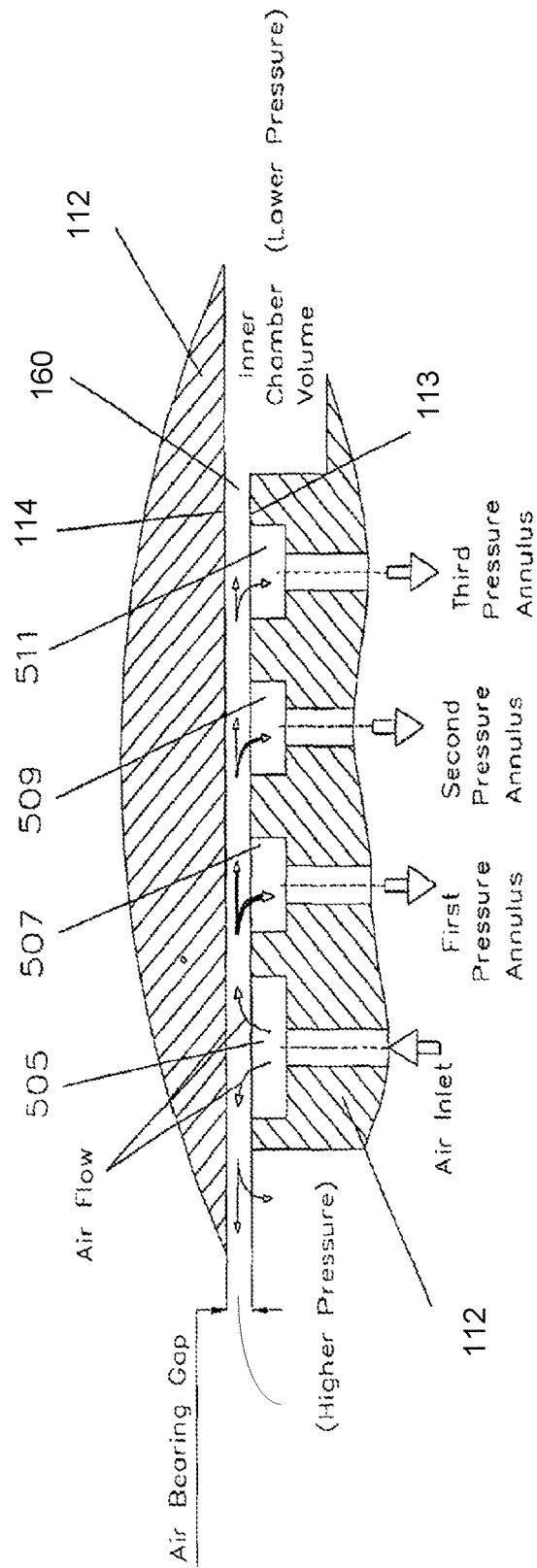
FIG. 5 illustrates a first dynamic seal according to an embodiment of the invention.

FIG. 5 illustrates the first dynamic seal 116 according to an embodiment of the invention. The first dynamic seal 116 is defined at a first interface 160 where the first surface 113 and the second surface 114 are close to each other.

It is assumed that the first interface 160 has an annular shape. The first dynamic seal 116 includes an air bearing annular groove 505 and an isolating land (adjacent to the groove) to provide a relatively contactless seal between the first and second surfaces 113 and 114 with a film of gas.

One or more gas pumps (not shown) provide compressed gas to the air bearing annular groove 505 via one or more gas supply conduits (not shown). In one embodiment, the gas supply conduits may be an array of gas nozzles and flow restrictors similar to the gas supply system disclosed in the commonly assigned U.S. Pat. No. 6,163,033. The one or more gas pumps may be operated separately, or under control of the above-mentioned system controller. The second surface 114 may be smooth, and in one embodiment, the first surface 113 is planar to enhance the low-friction characteristic of the interface.

The first surface 113 has an air bearing annular groove 505, a first pressure (in one embodiment, atmospheric pressure) annular groove 507, a second pressure (in one embodiment, relatively low vacuum) annular groove 509, and a third pressure (in one embodiment, relatively high vacuum) annular groove 511. These elements provide the first dynamic seal 116.

In one embodiment, the grooves are arranged so that they provide seals for increasing levels of vacuum going from outside the chamber to inside the chamber, so that the chamber in this embodiment is at a relatively high vacuum. However, it will be appreciated by those skilled in the art that the arrangement of the grooves, and their order, will depend on the application, the relative pressure differential inside and outside the chamber, and the like. It also will be appreciated that the number of grooves is not critical, but may be varied as desired.

Each plenum, annular grooves 507, 509, and 511, and its isolating land act to remove residual gas from the air bearing annular groove 505 until the required level of isolation is achieved at the seal interface. One or more exhaust conduits (not shown), which may be similar to the exhaust ports in the gas exhaust system disclosed in the commonly assigned U.S. Pat. No. 6,163,033, are coupled to each plenum to remove the residual gas. The conduits are connected to one or more vacuum pumps (not shown). The vacuum pumps may be operated separately, or under the control of the system controller. The necessary number of plenum stages depends upon the level of vacuum required and the pumping rate of the vacuum pumps in conjunction with the precision of the air bearing gap.

In another implementation, the groove structure 505-511 is provided on the second surface 114, rather than on the first surface. As discussed above, each plenum, vacuum annular grooves 507, 509, and 511, and its isolating land act to remove residual gas from the air bearing annular groove 505 until the required level of isolation is achieved at the seal interface.

The number of grooves and differ from four. The second dynamic seal 124 of FIG. 4 can resemble or be the same as the first dynamic seal 116.

Z-Stage Embodiments

According to various embodiments illustrated above the movement system included a XYZ stage. It is noted that the different stages for moving the chuck along various directions can be separated from each other.

FIG. 6 illustrates system 600 in which a Z stage (for vertical movement) 610 can be connected between the supporting element 115 and the movement control element 122, be integrated within one of these elements (115 and 122) or otherwise separated from the XY stage of the movement system.

FIG. 6 illustrates Z stage 610 as being connected between two parts of the movement control element 122 and is sealed by a flexible metallic below 612, to complete the sealing of the second chamber 120.

FIG. 7 illustrates method 700 according to an embodiment of the invention.

Method 700 starts by stage 710 of placing a substrate on a chuck that is located within a first chamber of the system. The system also includes a second chamber, and a movement system. The first chamber includes (i) a first element that has a first surface, (ii) a first chamber housing that includes a second surface, the first surface and the second surface come into proximity with each other at a first interface, (iii) a supporting element for supporting the chuck; and (iv) a first dynamic seal formed at the first interface and is arranged to seal the first chamber from the movement system. The second chamber includes (i) a second chamber housing; a movement system that is arranged to introduce movement between (a) the first chamber housing and (b) the first element and the chuck; and a movement control element for mechanically coupling the first element to the movement system.

Stage 710 is followed by stage 720 of applying an inspection or manufacturing process within the first chamber while sealing, by the first dynamic seal, the first chamber from the second chamber. Thus, contaminants generated within the second chamber are prevented from reaching the substrate.

The applying may include introducing movement, by the movement system, between the substrate and the first chamber housing.

Stage 700 can be executed by any of the systems mentioned above.

In the foregoing specification, the invention has been described with reference to specific examples of embodiments of the invention. It will, however, be evident that various modifications and changes may be made therein without departing from the broader spirit and scope of the invention as set forth in the appended claims.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or module elements or impose an alternate decomposition of functionality upon various logic blocks or module elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system comprising:
    a chuck;
    a substrate processing chamber configured to perform a substrate processing operation on a substrate supported by the chuck, the substrate processing chamber comprising a first element that has a first surface, a first chamber housing that includes a second surface spaced apart from the first surface at a first interface, and a supporting element for supporting the chuck within the first chamber;
    a second chamber comprising a second chamber housing;
    a movement system positioned within the second chamber housing and operatively coupled to move the chuck and the first element in relation to the first chamber housing; and
    a movement control element for mechanically coupling the first element to the movement system;
    wherein a first dynamic seal is formed at the first interface and is arranged to seal the substrate processing chamber from the movement system; and
    wherein the substrate processing chamber is an inspection chamber and further comprises an inspection column and wherein the chuck is positioned to support a substrate at a position spaced apart from the inspection column.

2. The system according to claim 1 further comprising pressure control elements for maintaining the substrate processing chamber at a lower pressure level than the second chamber.

3. The system according to claim 1, wherein the substrate processing chamber and the second chamber are maintained at substantially a same pressure level and wherein the system comprises filtering elements arranged to prevent contaminants generated within the second chamber to enter the substrate processing chamber.

4. The system according to claim 1 wherein the first element is a plate.

5. The system according to claim 1 wherein the first element defines an aperture and wherein the supporting element and the movement control element are connected to each other to form a support and movement control module that passes through the aperture.

6. The system according to claim 5 comprising a second dynamic seal formed at a second interface between the aperture and the support and movement control module.

7. The system according to claim 5 wherein the aperture is located at a center of the first element.

8. The system according to claim 1 wherein the supporting element and the movement control element are connected to each other to form a support and movement control module; and wherein the support and control module further comprises a horizontal movement stage.

9. The system according to claim 1 further comprising a load lock mechanism for allowing the insertion of a substrate to the substrate processing chamber and a removal of the substrate from the substrate processing chamber.

10. The system according to claim 1 wherein the first interface has an annular shape.

11. The system according to claim 10 wherein the dynamic seal includes an air bearing annular groove and an isolating land adjacent to the annular groove.

12. The system according to claim 11 further comprising a gas pump operatively coupled to provide compressed gas to the air bearing annular groove.

13. The system according to claim 10 wherein the dynamic seal comprises an annular air inlet; first, second and third annular grooves; a first landing between the air inlet and the first annular groove, a second landing between the first and second annular grooves and a third landing between second and third annular grooves.

* * * * *